(12) United States Patent
Yang et al.

(10) Patent No.: US 10,944,364 B2
(45) Date of Patent: Mar. 9, 2021

(54) CONFIGURABLE AMPLIFIER MODULE

(71) Applicant: Silicon Integrated Systems Corp., Hsinchu (TW)

(72) Inventors: Ssu-Che Yang, Taipei (TW); Wen-Chi Lin, Taipei (TW); Keng-Nan Chen, Taipei (TW)

(73) Assignee: Silicon Integrated Systems Corp., Hsinchu (TW)

( * ) Notice: Subject to any disclaimer, the term of this patent is extended or adjusted under 35 U.S.C. 154(b) by 121 days.

(21) Appl. No.: 16/416,230

(22) Filed: May 19, 2019

(65) Prior Publication Data

US 2019/0356272 A1    Nov. 21, 2019

(30) Foreign Application Priority Data

May 21, 2018   (TW) .................................. 107117279

(51) Int. Cl.
*H03F 1/07* (2006.01)
*H03F 1/02* (2006.01)
(52) U.S. Cl.
CPC .................................. *H03F 1/0211* (2013.01)
(58) Field of Classification Search
CPC .................. H03F 1/07; H03F 1/0288

USPC ............................................. 330/124 R, 295
See application file for complete search history.

(56) References Cited

U.S. PATENT DOCUMENTS

| 4,320,351 | A | 3/1982 | Brown, Jr. et al. |
| 7,719,351 | B2 | 5/2010 | Pertijs et al. |
| 9,671,437 | B2 | 6/2017 | Akahane |
| 2009/0319212 | A1* | 12/2009 | Cech .................. B60R 21/0136 702/65 |
| 2010/0244868 | A1 | 9/2010 | Cantave et al. |
| 2017/0346456 | A1 | 11/2017 | Corbishley |

FOREIGN PATENT DOCUMENTS

TW        201105890 A    2/2011

* cited by examiner

*Primary Examiner* — Henry Choe
(74) *Attorney, Agent, or Firm* — Mark M. Friedman

(57) ABSTRACT

A configurable amplifier module is disclosed. The configurable amplifier module includes a first amplifier having a non-inverting input, an inverting input, and a first output; a second amplifier having a non-inverting input, an inverting input, and a second output; a first resistor; a second resistor; a third resistor; a detecting unit connected to the second output of the second amplifier and configured to detect whether a current flows through the detecting unit; and a control unit connected to the second resistor and the detecting unit and configured to control the second resistor to be connected to the third resistor or a direct current signal.

10 Claims, 2 Drawing Sheets

CONFIGURABLE AMPLIFIER MODULE

TECHNICAL FIELD OF THE DISCLOSURE

The present disclosure relates to a technological field of amplifiers, and more particularly to a configurable amplifier module.

BACKGROUND OF THE DISCLOSURE

In a conventional dual-end output operational amplifier, outputs at dual ends cannot be adjusted according to a variation of a load. In detail, when one of the outputs at dual ends does not require to be used, the one of the outputs at dual ends cannot be turned off. Accordingly, waste of power consumption of the operational amplifier occurs.

Therefore, there is a need to solve the above-mentioned problem in the prior art.

SUMMARY OF THE DISCLOSURE

An objective of the present disclosure is to provide a configurable amplifier module capable of solving the problem in the prior art.

The configurable amplifier module of the present disclosure includes: a first amplifier having a non-inverting input, an inverting input, and a first output, and the non-inverting input of the first amplifier configured to receive a first input signal; a second amplifier having a non-inverting input, an inverting input, and a second output, and the non-inverting input of the second amplifier configured to receive a second input signal, wherein the first input signal and the second input signal are differential signals; a first resistor having a first end and a second end, the first end of the first resistor connected to the first output of the first amplifier, and the second end of the first resistor connected to the inverting input of the first amplifier; a second resistor having a first end and a second end, and the first end of the second resistor connected to the second end of the first resistor; a third resistor having a first end and a second end, the first end of the third resistor connected to the inverting input of the second amplifier, and the second end of the third resistor connected to the second output of the second amplifier; a detecting unit connected to the second output of the second amplifier and configured to detect whether a current flows through the detecting unit; and a control unit connected to the second resistor and the detecting unit, wherein the control unit is configured to control, according to a detecting result of the detecting unit, the second end of the second resistor to be connected to the first end of the third resistor or a direct current signal.

The configurable amplifier module of the present disclosure includes: a first amplifier having a non-inverting input, an inverting input, and a first output, and the non-inverting input of the first amplifier configured to receive a first input signal; a second amplifier having a non-inverting input, an inverting input, and a second output, and the non-inverting input of the second amplifier configured to receive a direct current signal; a first resistor having a first end and a second end, the first end of the first resistor connected to the first output of the first amplifier, and the second end of the first resistor connected to the inverting input of the first amplifier; a second resistor having a first end and a second end, and the first end of the second resistor connected to the second end of the first resistor; a third resistor having a first end and a second end, the first end of the third resistor connected to the inverting input of the second amplifier, and the second end of the third resistor connected to the second output of the second amplifier; a detecting unit connected to the second output of the second amplifier and configured to detect whether a current flows through the detecting unit; and a control unit connected to the second resistor and the detecting unit, wherein the control unit is configured to control, according to a detecting result of the detecting unit, the second end of the second resistor to be connected to the first end of the third resistor or the direct current signal.

The configurable amplifier module of the present disclosure can be adjusted as a dual-end output amplifier or a single-end output amplifier according to whether the load is disposed. When the configurable amplifier module is the single-end output amplifier, the objective of saving the power consumption can be achieved by turning off the second amplifier. Furthermore, when the configurable amplifier module is the single-end output amplifier, the amplification factor of the configurable amplifier module can be increased by adjusting the resistance values of the first resistor and the second resistor.

DETAILED DESCRIPTION OF THE DISCLOSURE

To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure, and as used herein, the term "embodiment" refers to an instance, an example, or an illustration but is not intended to limit the present disclosure. In addition, the articles "a" and "an" as used in the specification and the appended claims should generally be construed to mean "one or more" unless specified otherwise or clear from the context to be directed to a singular form. Also, in the appending drawings, the components having similar or the same structure or function are indicated by the same reference number.

Figure 1:
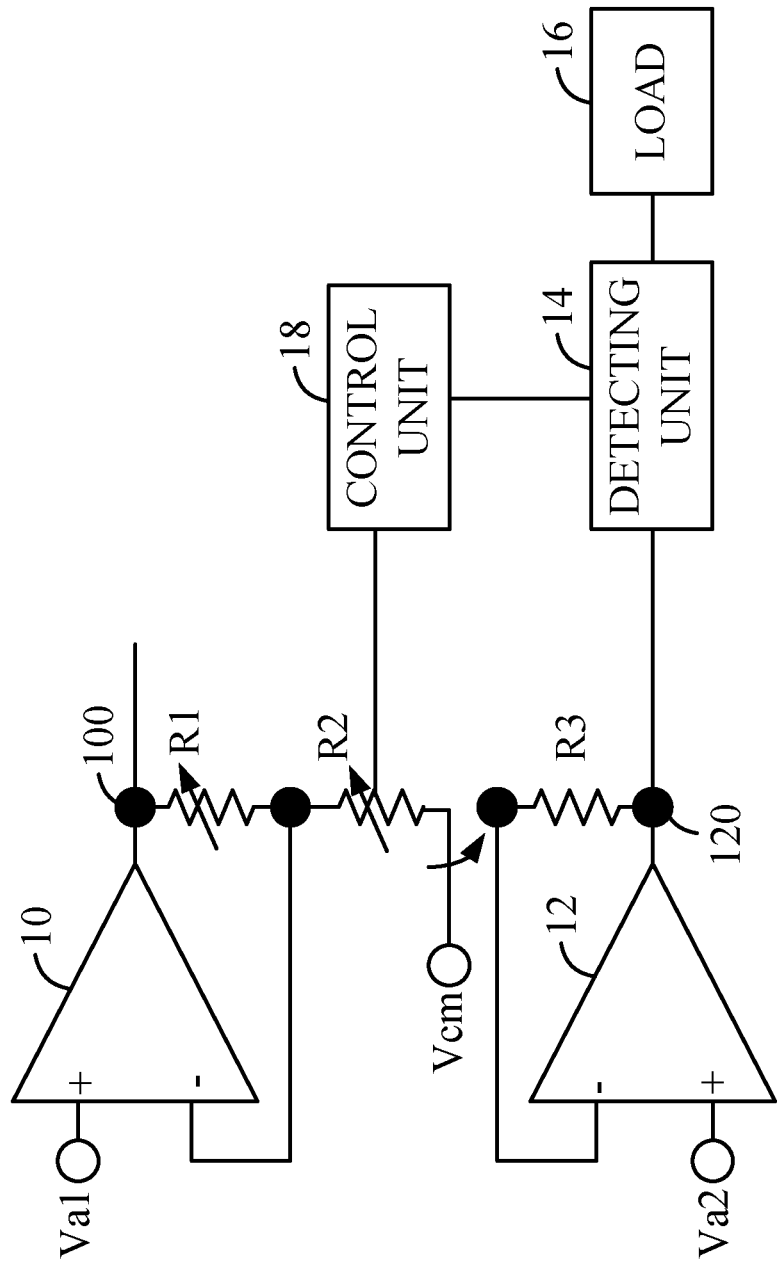
FIG. 1 illustrates a configurable amplifier module in accordance with an embodiment of the present disclosure.

Please refer to FIG. 1. FIG. 1 illustrates a configurable amplifier module in accordance with an embodiment of the present disclosure.

The configurable amplifier module includes a first amplifier 10, a second amplifier 12, a first resistor R1, a second resistor R2, a third resistor R3, a detecting unit 14, a load 16, and a control unit 18.

The first amplifier 10 has a non-inverting input+, an inverting input−, and a first output 100. The non-inverting input+ of the first amplifier 10 is configured to receive a first input signal Va1.

The second amplifier 12 has a non-inverting input+, an inverting input−, and a second output 120. The non-inverting input+ of the second amplifier 12 is configured to receive a second input signal Va2.

In the present embodiment, the first input signal Va1 and the second input signal Va2 are differential signals.

The first resistor R1 has a first end and a second end. The first end of the first resistor R1 is connected to the first output 100 of the first amplifier 10. The second end of the first resistor R1 is connected to the inverting input− of the first amplifier 10.

The second resistor R2 has a first end and a second end. The first end of the second resistor R2 is connected to the second end of the first resistor R1.

The third resistor R3 has a first end and a second end. The first end of the third resistor R3 is connected to the inverting input− of the second amplifier 12. The second end of the third resistor R3 is connected to the second output 120 of the second amplifier 12.

The detecting unit is connected to the second output 120 of the second amplifier 12. The detecting unit is configured to detect whether a current flows through the detecting unit 14.

The control unit 18 is connected to the second resistor R2 and the detecting unit 14.

The configurable amplifier module of the present disclosure further includes the load 16 connected to the detecting unit 14. The detecting unit 14 is configured to determine, via the load 16, whether the current flows through the detecting unit 14. In detail, when the load 16 is not disposed, the current is not generated. As such, the detecting unit 14 detects that the current flowing through the detecting unit 14 does not exist. The control unit 18 is configured to control, according to a detecting result of the detecting unit 14 (i.e., the detecting unit 14 detects that the current flowing through the detecting unit 14 does not exist), the second end of the second resistor R2 to be connected to the first end of the third resistor R3. The configurable amplifier module is used as a dual-end input and dual-end output amplifier. Inputs at dual ends include the non-inverting input+ of the first amplifier 10 and the non-inverting input+ of the second amplifier 12. Outputs at dual ends include the first output 100 of the first amplifier 10 and the second output 120 of the second amplifier 12.

When the load 16 is disposed, the current is generated. As such, the detecting unit 14 detects that the current flows through the detecting unit 14. The control unit 18 is configured to control, according to the detecting result of the detecting unit 14 (i.e., the detecting unit 14 detects that the current flows through the detecting unit 14), the second end of the second resistor R2 to be connected to a direct current signal Vcm. The configurable amplifier module is used as a dual-end input and single-end output amplifier. Inputs at dual ends include the non-inverting input+ of the first amplifier 10 and the second end of the second resistor R2. An output at a single end includes the first output 100 of the first amplifier 10. Since the first input signal Va1 is inputted to the non-inverting input+ of the first amplifier 10, the configurable amplifier module is configured to be a non-inverting amplifier. The second amplifier 120 can be turned off by the control unit 18 or other control circuits, thereby achieving an objective of saving power consumption.

When the configurable amplifier module is used as the dual-end input and single-end output amplifier, a gain is decreased since only the first amplifier 10 is used. In one embodiment, the first resistor R1 and the second resistor R2 are adjustable resistors. An amplification factor of the dual-end and single-end amplifier can be increased by adjusting a resistance value of the resistor R1 and a resistance value of the second resistor R2 (e.g., the control unit 18 adjusts the resistance value of the resistor R1 and the resistance value of the second resistor R2).

Figure 2:
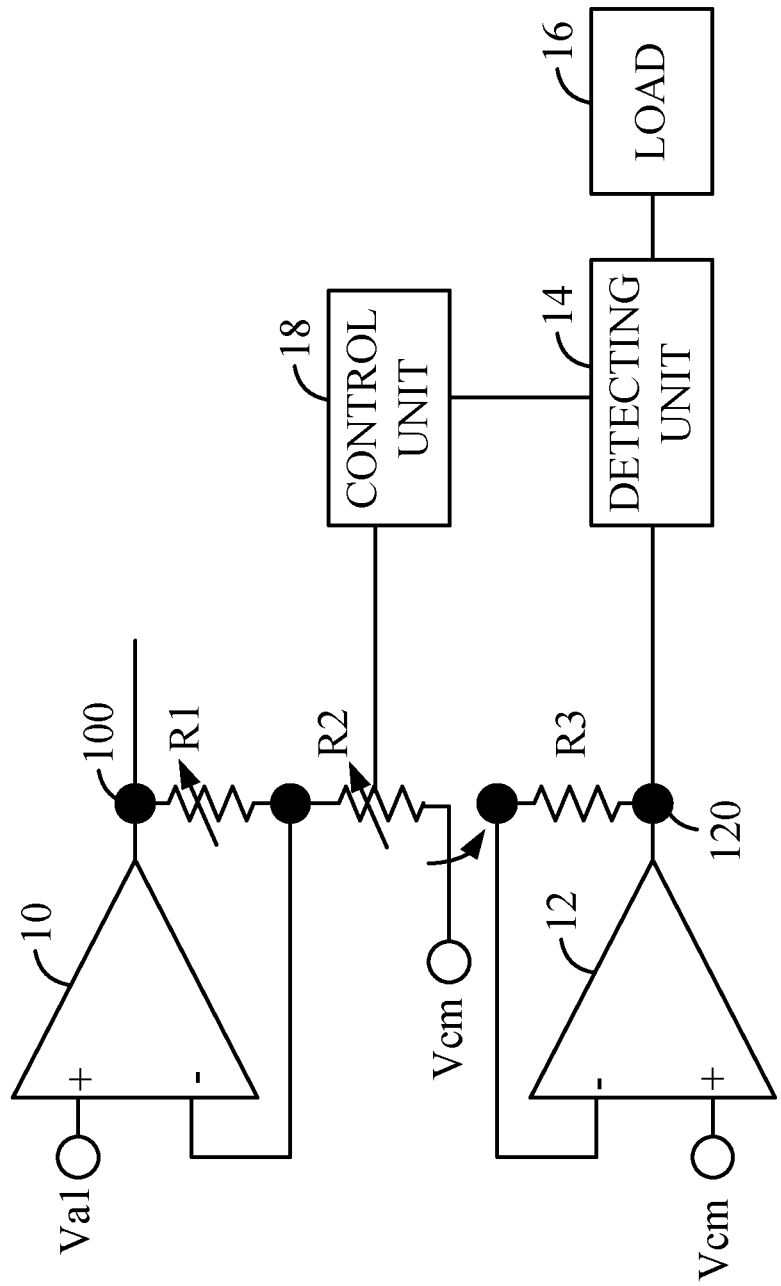
FIG. 2 illustrates a configurable amplifier module in accordance with another embodiment of the present disclosure.

Please refer to FIG. 2. FIG. 2 illustrates a configurable amplifier module in accordance with another embodiment of the present disclosure.

A difference between the configurable amplifier module in FIG. 2 and the configurable amplifier module in FIG. 1 is that in the configurable amplifier module in FIG. 2, the non-inverting input+ of the first amplifier 10 is configured to receive a first input signal Va1, and the non-inverting input+ of the second amplifier 12 is configured to receive a direct current signal Vcm. That is, the first input signal Va1 and the direct current signal Vcm are not differential signals. Elements not described can be referred to the corresponding descriptions in FIG. 1 and are not repeated herein.

When the load 16 is not disposed, the current is not generated. As such, the detecting unit 14 detects that the current flowing through the detecting unit 14 does not exist. The control unit 18 is configured to control, according to a detecting result of the detecting unit 14 (i.e., the detecting unit 14 detects that the current flowing through the detecting unit 14 does not exist), the second end of the second resistor R2 to be connected to the first end of the third resistor R3. Since the non-inverting input+ of the second amplifier 12 receives the direct current signal Vcm, the configurable amplifier module is used as a dual-end input and dual-end output amplifier. Inputs at dual ends include the non-inverting input+ of the first amplifier 10 and the non-inverting input+ of the second amplifier 12. Outputs at dual ends include the first output 100 of the first amplifier 10 and the second output 120 of the second amplifier 12.

When the load is disposed, the current is generated. As such, the detecting unit 14 detects that the current flows through the detecting unit 14. The control unit 18 is configured to control, according to the detecting result of the detecting unit 14 (i.e., the detecting unit 14 detects that the current flows through the detecting unit 14), the second end of the second resistor R2 to be connected to the direct current signal Vcm. The configurable amplifier module is used as a dual-end input and single-end output amplifier. Inputs at dual ends include the non-inverting input+ of the first amplifier 10 and the second end of the second resistor R2. An output at a single end includes the first output 100 of the first amplifier 10. Since the first input signal Va1 is inputted to the non-inverting input+ of the first amplifier 10, the configurable amplifier module is configured to be a non-inverting amplifier. The second amplifier 120 can be turned off by the control unit 18 or other control circuits, thereby achieving an objective of saving power consumption.

When the configurable amplifier module is used as the dual-end input and single-end output amplifier, a gain is decreased since only the first amplifier 10 is used. In one embodiment, the first resistor R1 and the second resistor R2 are adjustable resistors. An amplification factor of the dual-end and single-end amplifier can be increased by adjusting a resistance value of the resistor R1 and a resistance value of the second resistor R2 (e.g., the control unit 18 adjusts the resistance value of the resistor R1 and the resistance value of the second resistor R2).

The configurable amplifier module of the present disclosure can be adjusted as a dual-end output amplifier or a single-end output amplifier according to whether the load is disposed. When the configurable amplifier module is the single-end output amplifier, the objective of saving the power consumption can be achieved by turning off the second amplifier. Furthermore, when the configurable amplifier module is the single-end output amplifier, the amplification factor of the configurable amplifier module can be increased by adjusting the resistance values of the first resistor and the second resistor.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:

1. A configurable amplifier module, comprising:
a first amplifier having a non-inverting input, an inverting input, and a first output, and the non-inverting input of the first amplifier configured to receive a first input signal;
a second amplifier having a non-inverting input, an inverting input, and a second output, and the non-inverting input of the second amplifier configured to receive a second input signal, wherein the first input signal and the second input signal are differential signals;
a first resistor having a first end and a second end, the first end of the first resistor connected to the first output of the first amplifier, and the second end of the first resistor connected to the inverting input of the first amplifier;
a second resistor having a first end and a second end, and the first end of the second resistor connected to the second end of the first resistor;
a third resistor having a first end and a second end, the first end of the third resistor connected to the inverting input of the second amplifier, and the second end of the third resistor connected to the second output of the second amplifier;
a detecting unit connected to the second output of the second amplifier and configured to detect whether a current flows through the detecting unit; and
a control unit connected to the second resistor and the detecting unit,
wherein the control unit is configured to control, according to a detecting result of the detecting unit, the second end of the second resistor to be connected to the first end of the third resistor or a direct current signal.

2. The configurable amplifier module according to claim 1, further comprising a load connected to the detecting unit, and the detecting unit configured to determine, via the load, whether the current flows through the detecting unit.

3. The configurable amplifier module according to claim 1, wherein when the detecting unit detects that the current flowing through the detecting unit does not exist, the control unit is configured to control the second end of the second resistor to be connected to the first end of the third resistor.

4. The configurable amplifier module according to claim 1, wherein when the detecting unit detects that the current flows through the detecting unit, the control unit is configured to control the second end of the second resistor to be connected to the direct current signal.

5. The configurable amplifier module according to claim 4, wherein the first resistor and the second resistor are adjustable resistors.

6. A configurable amplifier module, comprising:
a first amplifier having a non-inverting input, an inverting input, and a first output, and the non-inverting input of the first amplifier configured to receive a first input signal;
a second amplifier having a non-inverting input, an inverting input, and a second output, and the non-inverting input of the second amplifier configured to receive a direct current signal;
a first resistor having a first end and a second end, the first end of the first resistor connected to the first output of the first amplifier, and the second end of the first resistor connected to the inverting input of the first amplifier;
a second resistor having a first end and a second end, and the first end of the second resistor connected to the second end of the first resistor;
a third resistor having a first end and a second end, the first end of the third resistor connected to the inverting input of the second amplifier, and the second end of the third resistor connected to the second output of the second amplifier;
a detecting unit connected to the second output of the second amplifier and configured to detect whether a current flows through the detecting unit; and
a control unit connected to the second resistor and the detecting unit,
wherein the control unit is configured to control, according to a detecting result of the detecting unit, the second end of the second resistor to be connected to the first end of the third resistor or the direct current signal.

7. The configurable amplifier module according to claim 6, further comprising a load connected to the detecting unit, and the detecting unit configured to determine, via the load, whether the current flows through the detecting unit.

8. The configurable amplifier module according to claim 6, wherein when the detecting unit detects that the current flowing through the detecting unit does not exist, the control unit is configured to control the second end of the second resistor to be connected to the first end of the third resistor.

9. The configurable amplifier module according to claim 6, wherein when the detecting unit detects that the current flows through the detecting unit, the control unit is configured to control the second end of the second resistor to be connected to the direct current signal.

10. The configurable amplifier module according to claim 9, wherein the first resistor and the second resistor are adjustable resistors.

* * * * *